United States Patent
Lee

(10) Patent No.: US 8,252,189 B2
(45) Date of Patent: Aug. 28, 2012

(54) NANO STRUCTURE FABRICATION

(75) Inventor: Kwangyeol Lee, Namyangju-si (KR)

(73) Assignee: Korea University Research and Business Foundation (KR)

( * ) Notice: Subject to any disclaimer, the term of this patent is extended or adjusted under 35 U.S.C. 154(b) by 406 days.

(21) Appl. No.: 12/468,300

(22) Filed: May 19, 2009

(65) Prior Publication Data

US 2010/0294741 A1  Nov. 25, 2010

(51) Int. Cl.
*B44C 1/22* (2006.01)
*C25F 3/00* (2006.01)
*H01L 21/311* (2006.01)
*B05D 1/32* (2006.01)

(52) U.S. Cl. ............ 216/11; 216/44; 427/256; 427/259; 427/270; 438/694; 438/700; 977/887

(58) Field of Classification Search .................. 977/887; 216/11, 44; 427/256, 259, 270; 438/694, 438/700
See application file for complete search history.

(56) References Cited

U.S. PATENT DOCUMENTS

| | | | |
|---|---|---|---|
| 6,565,763 B1 | 5/2003 | Asakawa et al. | |
| 6,579,643 B1 | 6/2003 | Gozdz | |
| 2003/0178316 A1* | 9/2003 | Jacobs et al. | 205/157 |
| 2004/0028812 A1* | 2/2004 | Wessels et al. | 427/248.1 |
| 2004/0077156 A1 | 4/2004 | Tsakalakos et al. | |
| 2006/0006463 A1* | 1/2006 | Islam et al. | 257/347 |
| 2006/0144812 A1* | 7/2006 | Imada et al. | 216/22 |
| 2008/0193359 A1* | 8/2008 | Yu et al. | 423/344 |

OTHER PUBLICATIONS

Loo et al. "Additive, nanoscale patterning of metal films with a stamp and a surface chemistry mediated transfer process: Applications in plastic electronics" Jul. 15, 2002 Applied Physics Letters. vol. 81, No. 3, p. 562-564.*
Stark, R. W. et al. "Microfluidic etching driven by capillary forces for rapid prototyping of gold structures" Feb. 7, 2003, Microelectronic Engineering, vols. 67-68, pp. 229-236.*
Wang, et al "Development of Ultra-High Density Silicon Nanowire Arrays for Electronics Applications" Nano Res (2008) 1: 9-21 DOI 10.1007/s12274-008-8005-8.
Pease III, et al "Self-formation of sub-60-nm half-pitch gratings with large areas through fracturing" Nature Nanotechnology, vol. 2, Sep. 2007; DOI 10.1038/nnano.2007.264.
McLellan, et al "Edge Spreading Lithography and Its Application to the Fabrication of Mesoscopic Gold and Silver Rings" J. Am. Chem. Soc. 2004, 126, 10830-10831.
Kawamura, et al "Periodic nanostructure array in crossed holographic gratings on silica glass by two interfered infrared-femtosecond laser pulses" Applied Physics Letters, vol. 79, No. 9, Aug. 27, 2001; pp. 1228-1230.
Baca, et al "Semiconductor Wires and Ribbons for High-Performance Flexible Electronics" Angew. Chem. Int. Ed. 2008, 47, 5524-5542; DOI: Oct. 1002/anie.200703238.

* cited by examiner

*Primary Examiner* — Parviz Hassanzadeh
*Assistant Examiner* — Margaret D Klunk
(74) *Attorney, Agent, or Firm* — Workman Nydegger

(57) ABSTRACT

A method for manufacturing a nano structure includes forming a stamp having a line pattern on a surface thereof, positioning the stamp upon a substrate, forming at least one protruded portion in the substrate substantially corresponding to the line pattern of the stamp, forming a protective coating layer on at least a portion of the at least one protruded portion, and removing a portion of the substrate by etching at least another portion of the at least one protruded portion not covered with the protective coating layer.

17 Claims, 9 Drawing Sheets

NANO STRUCTURE FABRICATION

BACKGROUND

Contemporary advances in nanotechnology have allowed several types of nano materials to become widely available in many different industries. The ability to measure and manipulate materials on a nanometer level now makes it possible to recognize new nano materials with enhanced properties and to thus broaden the application area of nano structures (e.g., nano wires) made with nano materials.

Typical nano materials may include small-molecule organic and polymer semiconductors, and provide enhanced electrical conductivity, good mechanical flexibility, low temperature processibility, inherent compatibility with plastics, and the like. Accordingly, nano structures made of such nano materials have been widely used for flexible and rigid displays based on light emitting diodes, electrophoretic inks, polymer-dispersed liquid crystals, radiofrequency identification tags and sensors, etc.

SUMMARY

Techniques and apparatuses for fabricating a nano structure are provided. In one embodiment, a method for manufacturing a nano structure includes forming a stamp having a line pattern on a surface thereof, positioning the stamp upon a substrate, forming at least one protruded portion in the substrate substantially corresponding to the line pattern of the stamp, forming a protective coating layer on at least a portion of the at least one protruded portion, and removing a portion of the substrate by etching at least another portion of the at least one protruded portion not covered with the protective coating layer.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
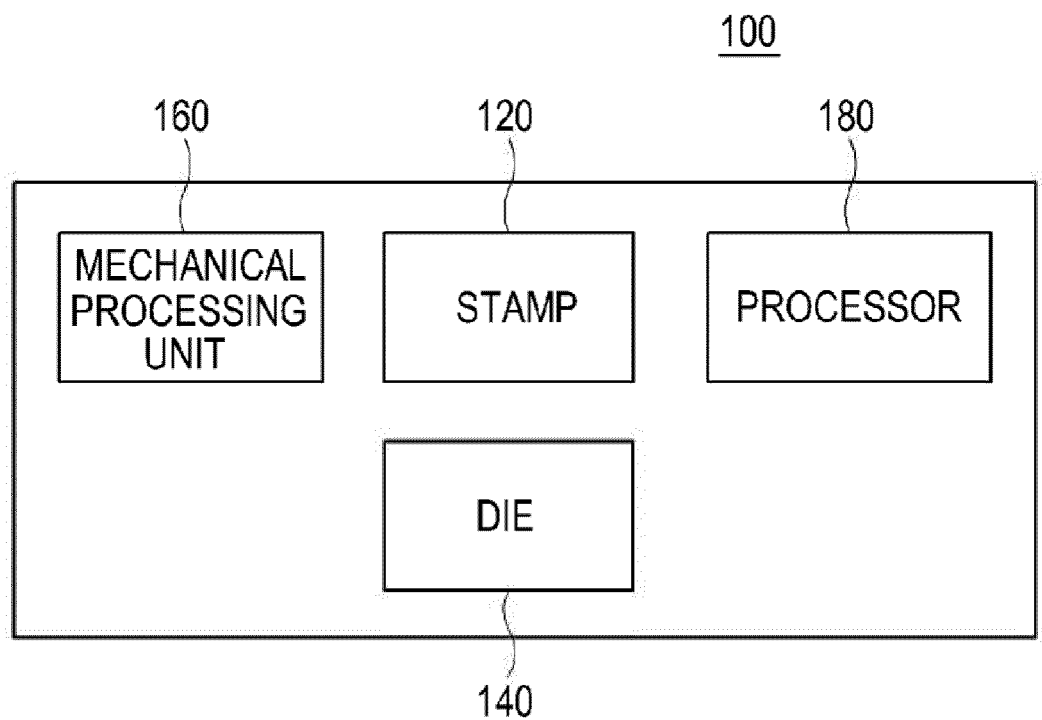
FIG. 1 is a schematic diagram of an illustrative embodiment of a nano structure manufacturing apparatus.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

FIG. 1 shows a schematic diagram of an illustrative embodiment of a nano structure manufacturing device 100. As depicted, nano structure manufacturing device 100 may include a stamp 120, a die 140, a mechanical processing unit 160, and a processor 180. Mechanical processing unit 160 may be configured to move and position a substrate (not shown) using a processing procedure (e.g., etching, stamping, etc.). For example, mechanical processing unit 160 may include a robot arm (not shown) that is configured to move stamp 120 in, for example, a vertical or a horizontal direction, and position the same onto a surface of die 140 (e.g., pressing stamp 120 onto the surface of die 140). Mechanical processing unit 160 may include, without limitation, any moving units including a robot arm, a motor, a conveyer belt and combinations thereof.

Processor 180 may be configured to control the overall operations of nano structure manufacturing device 100. For example, processor 180 may be configured to receive input from a user to operate mechanical processing unit 160, and to display the operation status for the user's reference. Processor 180 may include microprocessors, digital signal processors (DSPs), microcontrollers, and the like. At least one system memory may be embedded in or coupled to processor 180 to store and operate software applications, including an operating system, at least one application program, and other program modules for execution by processor 180.

Die 140 may be provided for placing a substrate (to be processed) thereupon. Die 140 may be configured to hold the substrate when stamp 120 is placed in contact with the surface of the substrate on die 140. Die 140 may be further configured to mount the substrate when an etching process is performed upon the substrate. Die 140 may be designed based on the size of the substrate so as to secure the substrate when stamp 120 is placed in contact with the surface thereof. Stamp 120 may be configured to present a predetermined amount of pressure upon the substrate positioned on die 140 under the control of mechanical processing unit 160. The amount of predetermined pressure may be proportional to, e.g., the weight of stamp 120. Stamp 120 may be integrated with die 140 as a single operating component of nano structure manufacturing device 100.

Figure 2:
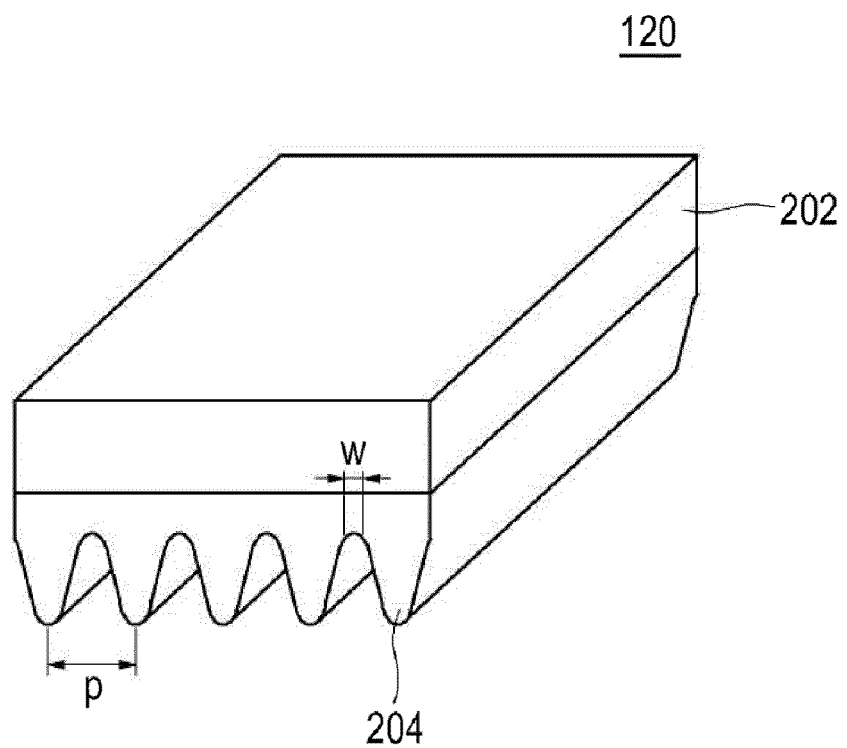
FIG. 2 is an illustrative embodiment of a stamp having a line pattern used in a nano structure manufacturing apparatus.

FIG. 2 is an illustrative embodiment of stamp 120 used in nano structure manufacturing apparatus 100. Stamp 120 may include a base plate 202 and a line pattern 204. Base plate 202 may be formed to have a predetermined area substantially corresponding to the size of a substrate upon which stamp 120 is to be placed (i.e., stamped). Line pattern 204 has corresponding gratings to provide multiple parallel line structures having one or more grooves and ridges. Line pattern 204 has a wave-like cross-sectional shape that can vary according to the design requirements/specification of the nano structure that is to be manufactured using nano structure manufacturing device 100 having stamp 120. Line pattern 204 has a predetermined width "w" and pitch "p" that can be defined according to the dimension/scale of the nano structure to be fabricated using stamp 120. For example, the width "w" of line pattern 204 may have a value that is determined based on the width of the nano structure (e.g., nano wire), and the pitch "p" of line pattern 204 may have a value that is determined based on the space between the adjacent nano structures that are to be manufactured using stamp 120 having line pattern 204. In some embodiments, the above predetermined width "w" may range from about 10 nm (nanometer) to about 20 nm, from about 10 nm to about 15 nm, from about 15 nm to about 20 nm, from about 10 nm to about 100 nm, from about 15 nm to about 100 nm, or from about 100 nm to about 1000 nm. In other embodiments, the predetermined width "w" may be about 10 nm, 15 nm, 20 nm, 50 nm, or 100 nm. In some embodiments, the above predetermined pitch "p" may range from about 0.5 um (micrometer) to about 1 um, from about 0.5 um to about 2 um, from about 1 um to about 2 um, from about 0.2 um to about 1 um, from about 1 um to about 5 um, or from about 0.5 um to about 10 um. In other embodiments, the predetermined pitch "p" may be about 1 um, 0.5 um, 2 um, or 5 um.

In one embodiment, stamp 120 may be manufactured by using any of a variety of well-known holographic grating techniques. For example, the holographic grating techniques may include encoding holographic gratings on various non-photosensitive materials such as silica glass plates, thereby forming stamp 120 made of the non-photosensitive materials and having line pattern 204 corresponding to the holographic gratings. In the holographic grating techniques, for example, two laser beams may be used to form a variety of periodic nano-patterns (e.g., a one-dimensional wire array) by changing the energy density and the incidence angle of the irradiation laser beams. It should be appreciated that various ranges of energy levels and properties (e.g., wavelength) of the laser pulse may be used as known in the art. In this way, the holographic gratings may be generated based on the interference between the two laser beams and encoded on non-photosensitive materials such as the silica glass plates to thereby manufacture stamp 120 having line pattern 204.

Figure 3A:
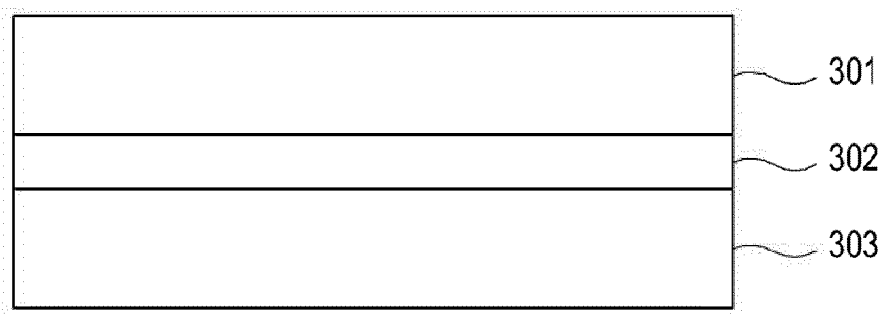
FIGS. 3A to 3C illustrate another illustrative embodiment of forming a line pattern in a stamp.
Figure 3B:
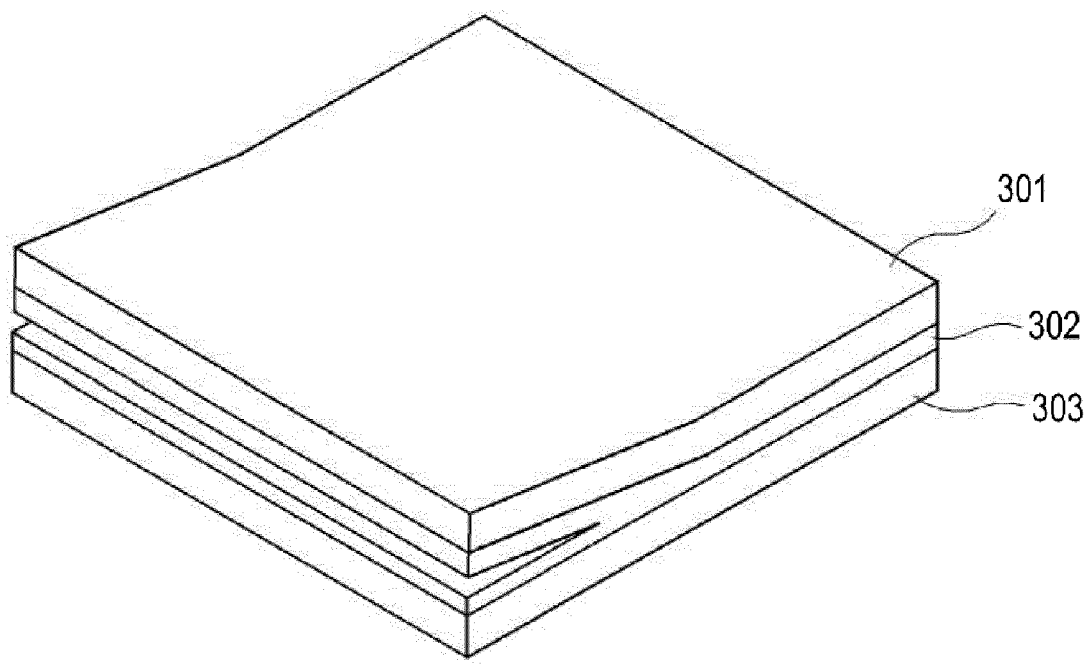
Figure 3C:
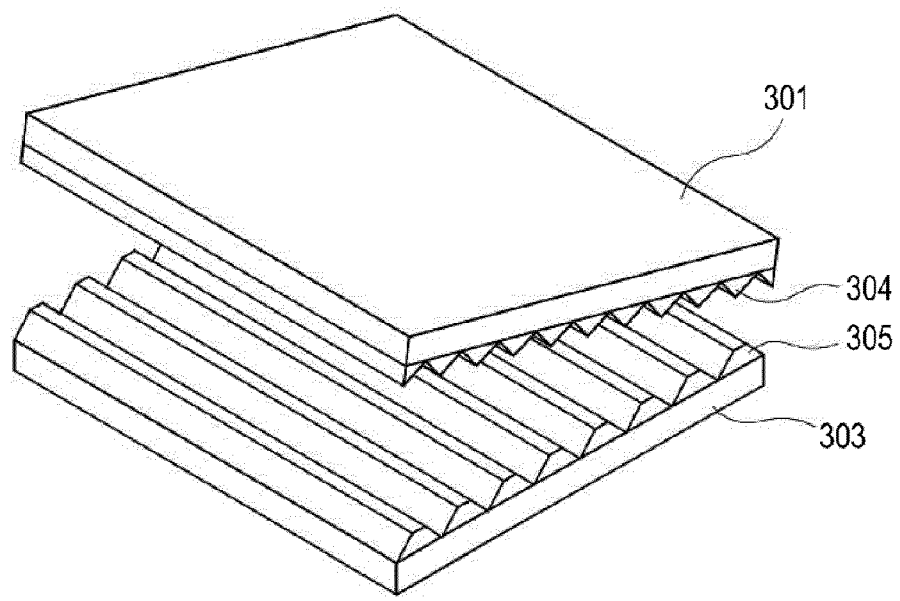

FIGS. 3A to 3C illustrate another illustrative embodiment of forming a line pattern (e.g., line pattern 204) in a stamp (e.g., stamp 120). In this illustrative embodiment, the stamp having the line pattern may be manufactured by using a fracture induced structuring (FIS) technique. Using the FIS technique, an intermediate layer 302 may be positioned between an upper layer 301 and a lower layer 303 (FIG. 3A). Intermediate layer 302 may be made of a featureless thin film. Upper layer 301 and lower layer 303 may be made in the form of a planar plate. Intermediate layer 302 may be made of various types of homo-polymers including, but not limited to, polystyrene, poly methylmethacrylate, polycarbonate and the like. Intermediate layer 302 may have a thickness ranging from about 30 nm to about 500 nm. Upper layer 301 and lower layer 303 may be made of any substantially rigid flat substrate such as a silicon wafer.

The FIS technique may include applying a coating of intermediate layer 302 on lower layer 303, e.g., by using a spin casting, and placing upper layer 301 on top of intermediate layer 302 to form a layered structure including upper layer 301 and lower layer 303 with intermediate layer 302 therebetween. The layered structure may be pressed while heating to ensure good adhesion between intermediate layer 302, upper layer 301 and lower layer 303. The layered structure may be separated at an edge, thereby causing a fracture of intermediate layer 302 (FIG. 3B). A razor blade or other type of cutting member may be inserted at one edge of intermediate layer 302 to separate the two plates (i.e., upper layer 301 and lower layer 303) apart. As the fracturing propagates from one edge of intermediate layer 302 to another edge, intermediate layer 302 may break into two substantially complementary sets of gratings 304 and 305 having the same period but with nonsymmetrical shapes, one set on each of upper layer 301 and lower layer 303 (FIG. 3C). Each of upper and lower layers 301 and 303 having gratings 304 and 305, respectively, can serve as a stamp having a line pattern (e.g., stamp 120 having grated line pattern 204).

Figure 4:
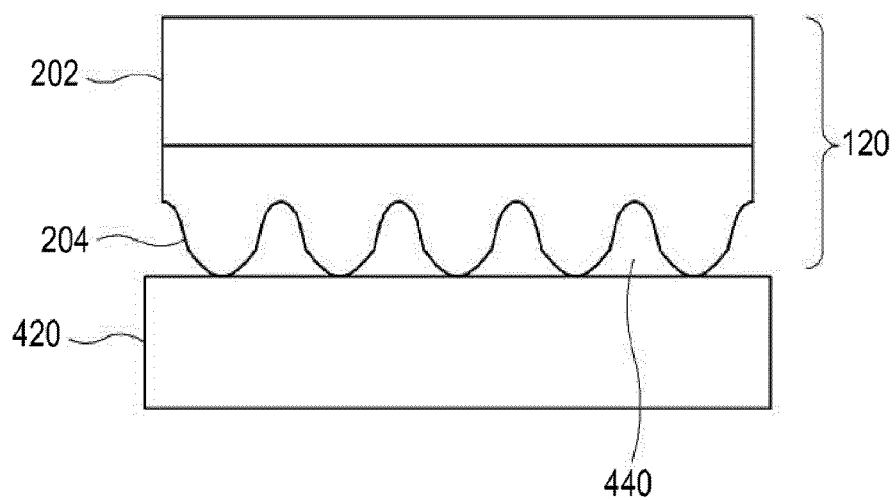
FIG. 4 shows a perspective view of the stamp of FIG. 2 positioned on a substrate to form channel pores.

FIG. 4 shows a perspective view of stamp 120 positioned on a substrate 420 to form channel pores 440 between stamp 120 and a surface of substrate 420. Substrate 420 may be made of any semiconductor substrate including, but not limited to, Silicon (Si), Gallium Arsenide (GaAs), Silicon-On-Insulator (SOI), GaAs/AlAs/SiGaAs, AlGaN/GaN/Si, and the like. In other embodiments, substrate 420 includes a non-semiconductor based substrate that is selected based on the properties of the substrate material (e.g., flexibility, dimension, cost, durability, etc.). Stamp 120 may be moved and positioned onto die 140 under the control of mechanical processing unit 160 to place line pattern 204 of stamp 120 in contact with the surface of substrate 420 disposed on die 140. Placing stamp 120 on the surface of substrate 420 may apply a gravity force on substrate 420 with a predetermined amount of pressure ("pressing operation"). The gravity force applied to substrate 420 may be determined, e.g., according to the weight of stamp 120, and may be substantially proportional thereto. As the weight of stamp 120 increases, the amount of pressure applied to substrate 420 may be higher. In some embodiments, a pressing unit (not shown) may be configured to press the top surface of stamp 120 so as to apply and control the amount of pressure that is applied onto substrate 420. Placing stamp 120 on substrate 420 with a predetermined amount of pressure may allow the protruded portion of line pattern 204 to contact the surface of substrate 420, thereby forming channel pores 440 between line pattern 204 of stamp 120 and substrate 420. The shape or size of channel pores 440 may be determined according to various factors including, but not limited to, the applied pressure, the perspective shape of grated line pattern 204 and the like. As the predetermined width "w" of line pattern 204 becomes wider (see FIG. 2), the width of the protruded portion of line pattern 204 contacting substrate 420 may become wider and the width of channel pores 440 may become narrower. With a given line pattern, as the amount of pressure applied to substrate 420 becomes higher, the width of the protruded portion of line pattern 204 contacting substrate 420 may become wider and the width of channel pores 440 may become narrower.

Figure 5A:
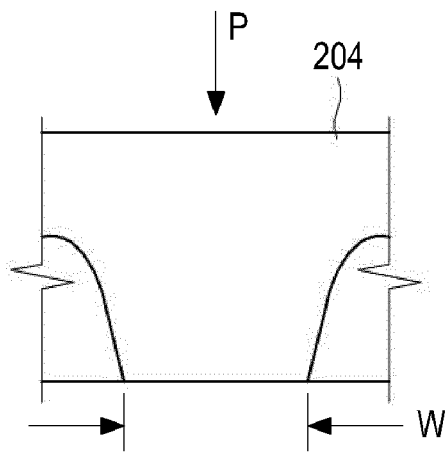
FIGS. 5A and 5B are illustrative views showing the relationship between pressure applied to the substrate of FIG. 4 and width of a line pattern contacting the substrate.
Figure 5B:
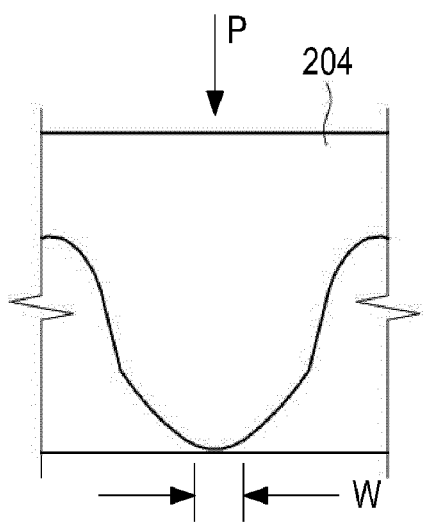

FIGS. 5A and 5B are illustrative views showing the relationship between the pressure applied to substrate 420 and width of a line pattern (e.g., line pattern 204) contacting substrate 420. When higher pressure "P" is applied on line pattern 204, a width "W" of line pattern 204 contacting substrate 420 may become wider (as shown in FIG. 5A). When lower pressure "P" is applied to line pattern 204, a width "W" of line pattern 204 contacting substrate 420 may become narrower (as shown in FIG. 5B). For example, pressure "P" may be determined according to the gravity force applied by the weight of stamp 120. Width "W" may range from about 10 nm (nanometer) to about 20 nm, from about 10 nm to about 15 nm, from about 15 nm to about 20 nm, from about 10 nm to about 100 nm, from about 15 nm to about 100 nm, or from about 100 nm to about 1000 nm. In other embodiments, the width "W" may be about 10 nm, 15 nm, 20 nm, 50 nm, or 100 nm.

Figure 6:
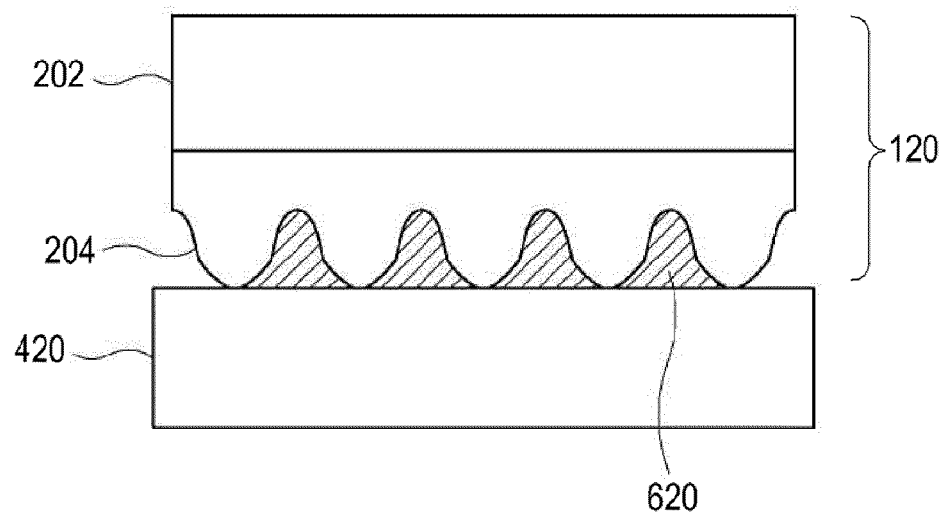
FIG. 6 shows a perspective view of the stamp of FIG. 2 positioned on the substrate of FIG. 4 with the channel pores filled with an etchant.

FIG. 6 shows a perspective view of stamp 120 positioned on substrate 420 with channel pores 440 (shown in FIG. 4) filled with an etchant 620. A layered structure of stamp 120 and substrate 420 (as shown in FIG. 4) is immersed in the etching solution with the layered structure tilted in such a way that one end of the layered structure is dipped into the etching solution while the other end of the layered structure remains out of the etching solution (not dipped in the etching solution). The etching solution that is absorbed into channel pores 420 may serve as an etching agent (e.g., etchant 620) to remove parts of substrate 420 that are not contacting with line pattern 204. A securing device (not shown) may be used to retain the layered structure together during the immersion process. In this way, the etching solution may be absorbed into channel pores 440 through capillary force so that channel pores 440 may be substantially filled with etchant 620. With channel pores 440 substantially filled with etchant 620, etching is performed upon the portion of substrate 420 contacting etchant 620 (corresponding to the portion not contacting line pattern 204), thereby replicating line pattern 204 on the surface of substrate 420 ("etching operation"). The etching may be performed by using any of a variety of well-known etching process. The etching may be carried out within clean room environments known in the art such as Class 1000 or Class 100 environments. Various types of etchant 620 known in the art may be used depending on the design specification of nano structures, e.g., according to the type of material of substrate 420. For example, etchant 620 may be made of any etching solution including, but not limited to, KOH solution, tetramethylammonium hydroxide (TMAOH) solution, $NH_3/H_2O_2/H_2O$ solution, phosphoric acid hydrogen peroxide ($H_3PO_4$) solution, and the like. KOH solution and TMAOH solution may be used for a Si substrate, $NH_3/H_2O_2/H_2O$ solution may be used for a SOI substrate, and $H_3PO_4$ solution may be used for a GaAs substrate.

Figure 7:
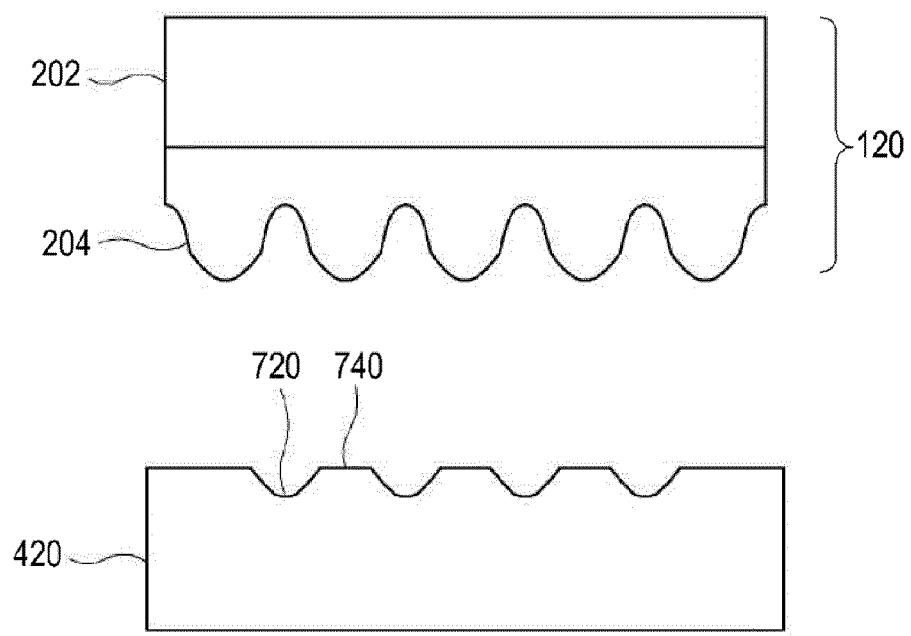
FIG. 7 shows a perspective view of the stamp of FIG. 2, and a substrate having grooves and ridges thereon.

As shown in the perspective view of stamp 120 in FIG. 7, line pattern 204 is replicated on substrate 420 so that substrate 420 has at least one depressed portion ("groove") 720 and protruded portion 740 ("ridge"). The width of groove 720 may be determined according to various factors such as the shape of line pattern 204 (e.g., width "w" and pitch "p"), the pressure applied to stamp 120 during the pressing operation, and the like. As the predetermined width "w" of line pattern 204 becomes wider (see FIG. 2) or as the amount of pressure "P" applied to substrate 420 becomes higher, the width "W" of the protruded portion of line pattern 204 contacting substrate 420 may become wider (see FIG. 2) and the width of groove 720 may become narrower and the width of ridge 740 may become wider, thereby allowing the width of nano structures to be wider. In one embodiment, the width of groove 720 may range from about 0.5 um to about 1 um, from about 0.5 um to about 2 um, from about 1 um to about 2 um, from about 0.2 um to about 1 um, from about 1 um to about 5 um, or from about 0.5 um to about 10 um.

In another embodiment, line pattern 204 may be replicated on the surface of substrate 420 by using a printing technique instead of using the pressing and etching operations described above. Ink may be transferred onto a protruded portion of line pattern 204 of stamp 120 by any of a variety of known methods, including direct inking, dipping into an ink tank, ink spraying, and the like. For example, mechanical processing unit 160 may be configured to move stamp 120 to dip the protruded portion of line pattern 204 of stamp 120 into the ink that may be formulated and/or designed to protect the surface of substrate 420 from the etching. Stamp 120 may be pressed against the surface of substrate 420 under the control of mechanical processing unit 160 to print the ink transferred onto a protruded portion of line pattern 204 on the surface of substrate 420 at locations substantially corresponding to the protruded portions of line pattern 204 ("printing operation"). In this way, the ink that may block substrate 420 from being etched may be deposited on parts of substrate 420 according to the gratings of line pattern 204. When stamp 120 is separated from substrate 420, an etching solution is applied on the surface of substrate 420 so that substrate 420 may be etched at locations in the surface of substrate 420 where no ink was previously printed during the printing operation (i.e., areas that are not protected by the ink). The ink that remains on substrate 420 may be removed. In this way, parts of substrate 420 remain at locations in the surface of substrate 420 where the ink has been printed by the printing operation, thereby replicating line pattern 204 on the surface of substrate 420 to provide substrate 420 having at least one groove (e.g., groove 720) and ridge (e.g., ridge 740).

Figure 8:
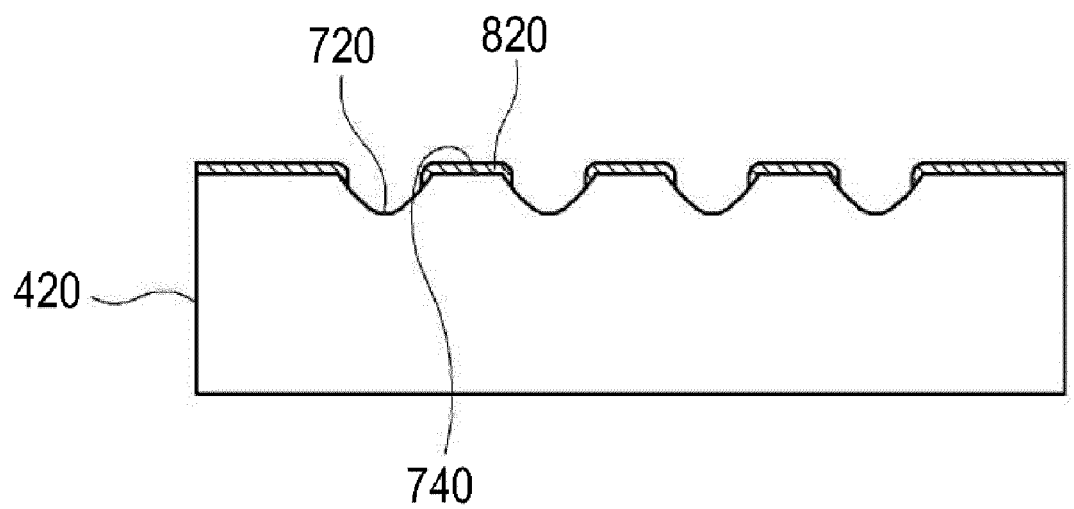
FIG. 8 shows a perspective view of the substrate of FIG. 7 having grooves with protruded portions coated with a protective coating layer.

FIG. 8 shows a perspective view of substrate 420 having at least one groove 720 and at least one ridge 740 coated with a protective coating layer 820. Protective coating layer 820 may be made of any material that is impenetrable by etchant 620 including, but is not limited to, Au, Ag, Pt, Ti, and the like. The type of protective coating layer 820 may vary according to the material of substrate 420 and the type of etchant 620. A combination of two or more metals may be used to form protective coating layer 820. For example, a metal (e.g., Pt) may be coated onto the top and edge of ridges 740 to form protective coating layer 820. A Pt metal may be deposited using, e.g., e-beam evaporation, with one edge of substrate 420 held at a predetermined tilt angle (e.g., 45 degrees) to the incident flux of Pt atoms ("oblique side coating"). The oblique side coating is repeated by holding the other edge of substrate 420 at a predetermined tilt angle (e.g., 45 degrees) to the incident flux of Pt atoms. In this way, a top and an edge portion of ridge 740 may be coated with protective coating layer 820, as shown in FIG. 8.

Any of a variety of well-known etching methods may be used to remove parts of substrate 420 that are not covered by protective coating layer 820. The etching process may vary according to the types of substrate 420 to be etched. For example, an anisotropic chemical wet etching technique may be used to etch substrate 420 made of GaAs in a phosphoric acid hydrogen peroxide solution according to the mechanism given in the reaction equation below.

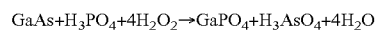

$$GaAs+H_3PO_4+4H_2O_2 \rightarrow GaPO_4+H_3AsO_4+4H_2O$$

The above reaction includes chemical oxidation of GaAs by hydrogen peroxide, followed by removal of the oxidized products by phosphoric acid. When the etching process completes, protective coating layer 820 may be removed, e.g., using aqua regia to produce an array of nano structures. In this way, the unprotected parts of substrate 420 are removed to produce a thin nano structure. The thin nano structure may include nano wire, nano platelet, nano ribbon, nano palates, nano bars, nano tubes, and the like. The nano structure may have width corresponding to the width "w" of line pattern 204 of stamp 120. For example, the width of nano structure may range from about 10 nm (nanometer) to about 20 nm, from about 10 nm to about 15 nm, from about 15 nm to about 20 nm, from about 10 nm to about 100 nm, from about 15 nm to about 100 nm, or from about 100 nm to about 1000 nm.

Figure 9:
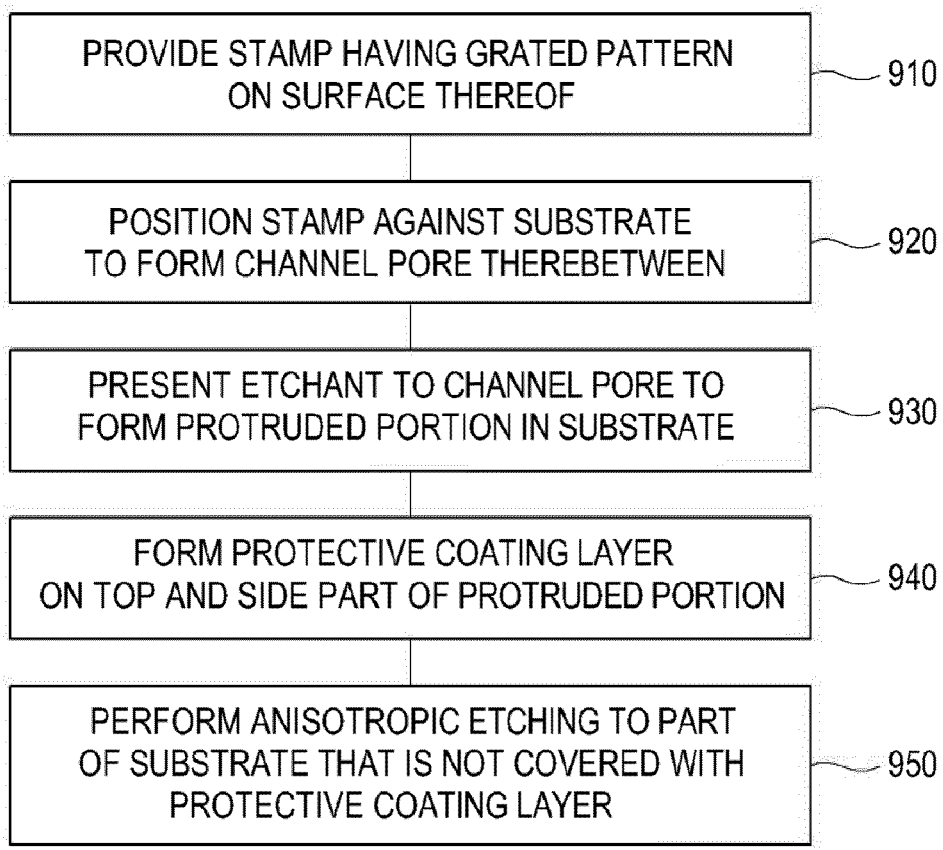
FIG. 9 shows an example flow diagram of an illustrative embodiment of a method for manufacturing a nano structure.

FIG. 9 shows an example flow diagram of an illustrative embodiment of a method for manufacturing a nano structure. In block 910, stamp 120 having base plate 202 and line pattern 204 on the surface of stamp 120 is provided. Line pattern 204 has gratings to provide multiple parallel line structures having one or more grooves and ridges. Line pattern 204 has a wave-like cross sectional shape that can vary according to the design requirements/specification of the nano structure that is to be manufactured by using nano structure manufacturing device 100 having stamp 120. As shown in FIG. 2, line pattern 204 has a predetermined width "w" and pitch "p" that can be defined according to the dimension/scale of the nano structure to be fabricated using stamp 120. For example, width "w" of line pattern 204 may have a value that is determined according to the width of the nano structure (e.g., nano wire), and pitch "p" of line pattern 204 may have a value that is determined according to the space between the adjacent nano structures that are to be manufactured through use of stamp 120 having line pattern 204. Stamp 120 may be manufactured by using various techniques, including but not limited to holographic grating techniques, fracture induced structuring (FIS) techniques, and the like, as described above.

In block 920, stamp 120 is positioned substantially adjacent substrate 420 to form at least one channel pore 440 between stamp 120 and a surface of substrate 420. Stamp 120 may be moved and positioned on die 140 under the control of mechanical processing unit 160 to place line pattern 204 of stamp 120 in contact with the surface of substrate 420 disposed on die 140. Placing stamp 120 on the surface of substrate 420 may apply a gravity force on substrate 420 with a predetermined amount of pressure ("pressing operation"). The gravity force applied to substrate 420 may be determined, e.g., according to the weight of stamp 120, and may substantially proportional thereto. As the weight of stamp 120 increases, the amount of pressure applied to substrate 420 may be higher. In some embodiments, a pressing unit (not shown) may be configured to press the top surface of stamp 120 so as to apply and control the amount of pressure that is applied onto substrate 420. Placing stamp 120 on substrate 420 with a predetermined amount of pressure may allow the protruded portion of line pattern 204 to contact the surface of substrate 420, thereby forming channel pores 440 between line pattern 204 of stamp 120 and substrate 420. The shape or size of channel pores 440 may be determined according to various factors including, but not limited to, the applied pressure, the perspective shape of grated line pattern 204, and the like. As the predetermined width "w" of line pattern 204 becomes wider (see FIG. 2), the width of the protruded portion of line pattern 204 contacting substrate 420 may become wider and the width of channel pores 440 may become narrower. With a given line pattern, as the amount of pressure applied to substrate 420 becomes higher, the width of the protruded portion of line pattern 204 contacting substrate 420 may become wider and the width of channel pores 440 may become narrower.

In block 930, etchant 620 is presented to channel pores 440 to form at least one protruded portion 740 and at least one depressed portion 720. A layered structure of stamp 120 and substrate 420 (as shown in FIG. 4) is immersed in the etching solution with the layered structure tilted in such a way that one end of the layered structure is dipped into the etching solution while the other end of the layered structure remains out of the etching solution (not dipped in the etching solution). The etching solution that is absorbed into channel pores 420 may serve as an etching agent (e.g., etchant 620) to remove parts of substrate 420 that are not contacting with line pattern 204. A securing device (not shown) may be used to retain the layered structure together during the immersion process. In this way, the etching solution may be absorbed into channel pores 440 through capillary force so that channel pores 440 may be substantially filled with etchant 620. With channel pores 440 substantially filled with etchant 620, etching is performed upon the portion of substrate 420 contacting etchant 620 (corresponding to the portion not contacting line pattern 204), thereby replicating line pattern 204 on the surface of substrate 420 ("etching operation"). The etching may be performed by using any of a variety of well-known etching processes. Consequently, as shown in FIG. 7, line pattern 204 is replicated on substrate 420 so that substrate 420 has at least one groove 720 and ridges 740. The width of groove 720 may be determined according to various factors such as the shape of line pattern 204 (e.g., width "w" and pitch "p"), the pressure applied to stamp 120 during the pressing operation, and the like. As the predetermined width "w" of line pattern 204 becomes wider (see FIG. 2) or as the amount of pressure "P" applied to substrate 420 becomes higher, the width "W" of the protruded portion of line pattern 204 contacting substrate 420 may become wider (see FIG. 2) and the width of groove 720 may become narrower and the width of ridge 740 may becomes wider, thereby allowing the width of nano structures to be wider. In one embodiment, the width of groove 720 may range from about 0.5 um to about 1 um, from about 0.5 um to about 2 um, from about 1 um to about 2 um, from about 0.2 um to about 1 um, from about 1 um to about 5 um, or from about 0.5 um to about 10 um.

In block 940, protective coating layer 820 is formed on a top and a side part of protruded portion 740 of substrate 420. Protective coating layer 820 may be made of any material that is impenetrable by etchant 620 including, but is not limited to, Au, Ag, Pt, Ti, and the like. The type of protective coating layer 820 may vary according to the material of substrate 420 and the type of etchant 620. A combination of two or more metals may be used to form protective coating layer 820. For example, a metal (e.g., Pt) may be coated onto the top and edge of ridges 740 to form protective coating layer 820. A Pt metal may be deposited using, e.g., e-beam evaporation, with one edge of substrate 420 held at a predetermined tilt angle (e.g., 45 degrees) to the incident flux of Pt atoms ("oblique side coating"). The oblique side coating is repeated by holding the other edge of substrate 420 at a predetermined tilt angle (e.g., 45 degrees) to the incident flux of Pt atoms. In this way, a top and an edge portion of ridge 740 may be coated with protective coating layer 820, as shown in FIG. 8.

In block 950, parts of substrate 420 that are not covered by protective coating layer 820 are etched. Any of a variety of well-known etching methods may be used to remove parts of substrate 420 that are not protected by protective coating layer 820. The etching process may vary according to the types of substrate 420 to be etched. For example, an anisotropic chemical wet etching technique may be used to etch substrate 420 made of GaAs in a phosphoric acid hydrogen peroxide solution according to the mechanism given in the reaction equation below.

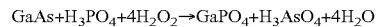

$$GaAs + H_3PO_4 + 4H_2O_2 \rightarrow GaPO_4 + H_3AsO_4 + 4H_2O$$

The above reaction includes chemical oxidation of GaAs by hydrogen peroxide, followed by removal of the oxidized products by phosphoric acid. When the etching process completes, protective coating layer 820 may be removed e.g., using aqua regia to produce an array of nano structures. In this way, the unprotected parts of substrate 420 are removed to produce a thin nano structure. The thin nano structure may include nano wire, nano platelet, nano ribbon, nano palates, nano bars, nano tubes, and the like. The nano structure may have width corresponding to the width "w" of line pattern 204 of stamp 120. For example, the width of nano structure may range from about 10 nm (nanometer) to about 20 nm, from about 10 nm to about 15 nm, from about 15 nm to about 20 nm, from about 10 nm to about 100 nm, from about 15 nm to about 100 nm, or from about 100 nm to about 1000 nm.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 10:
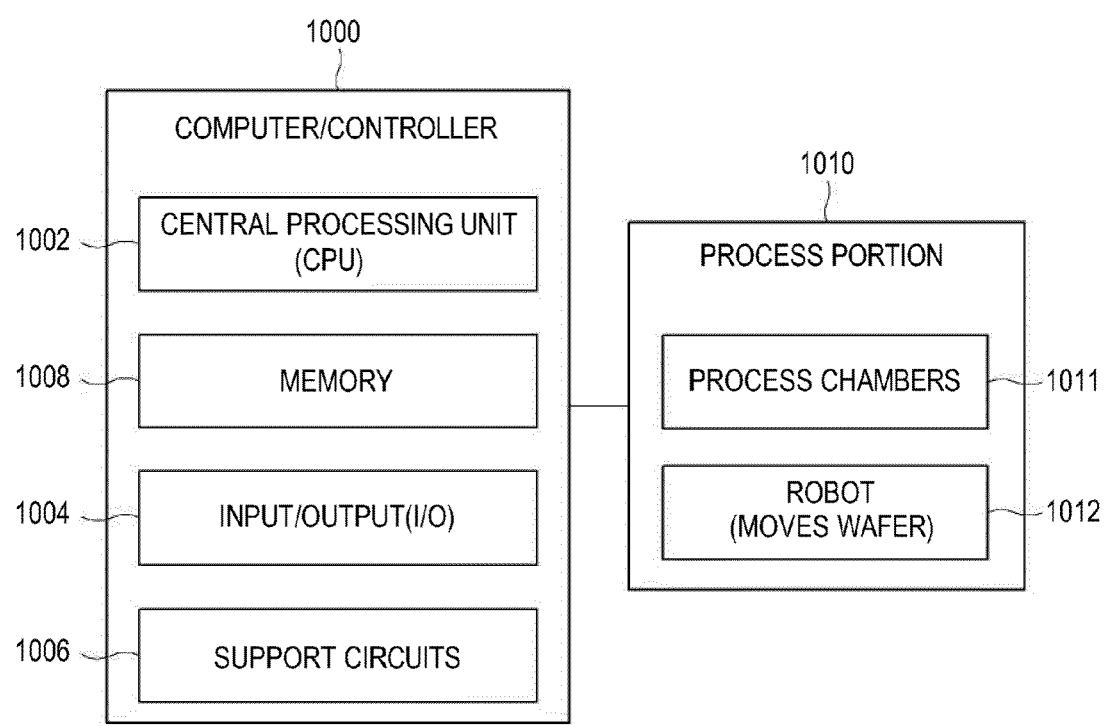
FIG. 10 shows a block diagram of an illustrative embodiment of a computer/controller for controlling the operations of the method illustrated in FIG. 9.

FIG. 10 shows a block diagram of an illustrative embodiment of a computer or a controller that can control the operations of the process illustrated in FIG. 9. As depicted, a controller/computer 1000 is coupled to a process portion ("fab") 1010. Process portion 1010 includes a variety of process chambers 1011 between which the substrate 420 is processed using a robot mechanism 1012 to move a wafer. The processing varies according to the depth/width of materials that are deposited and then etched, the pattern being imprinted and then etched using the above-described method. Such processes include chemical vapor deposition, physical vapor deposition, electro-chemical deposition, and reactive ion etching (RIE), which are known for depositing and/or etching specific materials within process portion 1010. Controller/computer 1000 includes a central processing unit (CPU) 1002, a memory 1008, support circuits 1006, and input/output (I/O) circuits 1004. CPU 1002 may be a general purpose computer that, when programmed by executing software contained in memory 1008, becomes a specific purpose computer for controlling the hardware components of process portion 1010. Memory 1008 may comprise Read-Only-Memory (ROM), Random Access Memory (RAM), removable storage, a hard disk drive, or any form of digital memory device. I/O circuits 1004 may include well-known displays for the output of information while a keyboard, mouse, track ball, or other input device can allow for programming of controller/computer 1000 to determine the processes performed by process portion 1010 (including the associated robot action included in process portion 1010). Support circuits 1006 are well-known in the art and include circuits such as cache, clocks, power supplies, and the like. Memory 1008 contains control software that, when executed by CPU 1002, enables controller/computer 1000 to digitally control the various components of process portion 1010. In another embodiment, computer/controller 1000 may be analog. For instance, application specific integrated circuits are capable of controlling processes such as those which occur within process portion 1010.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g. the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above.

From the foregoing, it will be appreciated that various embodiments of the present disclosure have been described herein for purposes of illustration, and that various modifications may be made without departing from the scope and spirit of the present disclosure Accordingly, the various embodiments disclosed herein are not intended to be limiting, with the true scope and spirit being indicated by the following claims.

The invention claimed is:

1. A method for manufacturing a nano structure comprising:
   forming a stamp having a line pattern on a surface thereof, the line pattern including protrusions having a first width;
   pressing the protrusions of the stamp against a substrate to form a plurality of open channel pores between the stamp and the substrate;
   controlling a channel pore shape and/or size of the plurality of open channel pores by controlling an applied pressure on the stamp, wherein increasing the applied pressure results in the protrusions having a second width greater than the first width;
   forming at least one protruded portion in the substrate with an etchant that substantially fills the plurality of open channel pores, wherein the at least one protruded portion substantially corresponds to the line pattern of the stamp;
   forming a protective coating layer on at least a portion of the at least one protruded portion; and
   removing a portion of the substrate that is not covered with the protective coating layer by etching.

2. The method of claim 1, wherein forming the stamp comprises encoding a holographic grating onto the surface of the stamp.

3. The method of claim 1, wherein the stamp comprises at least one material selected from the group consisting of, a polymer, a polystyrene, a poly(methyl methacrylate), a homopolymer, and a polycarbonate.

4. The method of claim 1, wherein forming the stamp includes employing fracture induced structuring (FIS) techniques.

5. The method of claim 4, wherein employing the FIS techniques comprises:
   providing a lower layer;
   forming an intermediate layer upon the lower layer;
   superimposing an upper layer upon the intermediate layer so as to position the intermediate layer between the lower and upper layers, thereby forming a layered structure of the lower layer, the intermediate layer and the upper layer;
   heating at least a portion of the layered structure so as to substantially affix the intermediate layer to the lower and upper layers; and
   separating the lower and upper layers so as to form gratings of the intermediate layer substantially corresponding to the line pattern of the stamp.

6. The method of claim 5, wherein the lower and upper layers are each fabricated from a silicon material, and the intermediate layer comprises at least one material selected from the group consisting of a polymer, a polystyrene, a poly(methyl methacrylate), a homopolymer, and a polycarbonate.

7. The method of claim 1, wherein forming the protective coating layer includes forming the protective coating layer on a top portion and an edge portion of the at least one protruded portion.

8. The method of claim 1, wherein the applied pressure is substantially associated with the weight of the stamp.

9. The method of claim 1, wherein the etchant solution is fabricated from at least one material selected from the group consisting of $NH_3$, KOH, and TMAOH.

10. The method of claim 1, wherein the substrate is fabricated from at least one material selected from the group consisting of SOI, GaAs/AlAs/SiGaAs, and AlGaN/GaN/Si.

11. The method of claim 10, wherein the nano structure has a width of from about 10 nm to about 100 nm.

12. The method of claim 1, wherein the nano structure is selected from at least one member of the group consisting of nano wires, nano platelet, nano ribbon, nano palates, nano bars, and nano tubes.

13. A method for fabricating a nanostructure, comprising:
   forming a stamp having a plurality of nanostructures, each nanostructure including a first width, the plurality of nanostructures fabricated from a polymer material;
   positioning the plurality of nanostructures of the stamp in contact with a surface of a substrate forming a plurality of channels;
   forming a plurality of grooves in the substrate having a configuration at least partially based on a configuration of the plurality of nanostructures of the stamp by substantially filling the plurality of channels with an etchant solution via capillary force;
   controlling a groove size of the plurality of grooves by controlling an applied pressure on the stamp, wherein increasing the applied pressure results in the nanostructures having a second width greater than the first width that narrows the groove size of the plurality of grooves formed;
   forming a protective coating on the substrate at least adjacent to the plurality of grooves; and
   removing portions of the substrate that are not covered by the protective coating.

14. The method of claim 13, wherein the plurality of nanostructures of the stamp exhibit a width of about 10 nm to about 100 nm and a pitch of about 0.2 µm to about 1 µm.

15. A method for fabricating a nanostructure, comprising:
   positioning a plurality of nanostructures of a stamp on a surface of a substrate to form a plurality of channels therebetween, each nanostructure having a first width;
   adjusting a channel pore size of the plurality of channels by adjusting an applied pressure on the stamp, wherein increasing the applied pressure results in the nanostructures having a second width greater than the first width that narrows the channel pore size;
   exposing selected regions of the surface of the substrate to an etchant through the plurality of channels;
   etching the selected regions of the substrate with the etchant to form a plurality of grooves in the substrate having a configuration at least partially based on a configuration of the plurality of nanostructures of the template;
   forming a protective coating on the substrate at least adjacent to the plurality of grooves; and
   removing portions of the substrate that are not covered by the protective coating to form the nanostructure.

16. The method of claim 15, wherein exposing selected regions of the surface of the substrate to an etchant through the plurality of channels comprises infiltrating the etchant into the plurality of channels.

17. The method of claim 15 wherein the plurality of nanostructures of the stamp are fabricated from a material comprising at least one member selected from the group consisting of polystyrene, poly(methyl methacrylate), a homopolymer, and polycarbonate.

* * * * *

UNITED STATES PATENT AND TRADEMARK OFFICE
CERTIFICATE OF CORRECTION

| | | |
|---|---|---|
| PATENT NO. | : 8,252,189 B2 | Page 1 of 1 |
| APPLICATION NO. | : 12/468300 | |
| DATED | : August 28, 2012 | |
| INVENTOR(S) | : Lee | |

It is certified that error appears in the above-identified patent and that said Letters Patent is hereby corrected as shown below:

On the Title Page, in Field (73), under "Assignee", in Column 1, Line 2, delete "Foundation" and insert -- Foundation, Seoul --, therefor.

On the Title Page, in Field (56), under "OTHER PUBLICATIONS", in Column 2, Line 21, delete "Oct." and insert -- 10. --, therefor.

In Column 1, Line 14, delete "processibility," and insert -- processability, --, therefor.

In Column 3, Line 19, delete "um" and insert -- μm --, therefor at each occurrence throughout the specification.

In Column 3, Line 63, delete "301" and insert -- 301, --, therefor.

In Column 10, Line 12, delete "(e.g." and insert -- (e.g., --, therefor.

In Column 10, Line 39, delete "etc"" and insert -- etc." --, therefor.

In Column 10, Line 46, delete "etc"" and insert -- etc." --, therefor.

In Column 11, Line 12, delete "disclosure" and insert -- disclosure. --, therefor.

In Column 13, Line 5, in Claim 17, delete "15" and insert -- 15, --, therefor.

Signed and Sealed this
Eighth Day of January, 2013

David J. Kappos
*Director of the United States Patent and Trademark Office*